US008946876B2

(12) United States Patent
Seto

(10) Patent No.: US 8,946,876 B2
(45) Date of Patent: Feb. 3, 2015

(54) SEMICONDUCTOR DEVICE

(71) Applicant: Sharp Kabushiki Kaisha, Osaka-shi, Osaka (JP)

(72) Inventor: Tsuyoshi Seto, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/348,061

(22) PCT Filed: Sep. 25, 2012

(86) PCT No.: PCT/JP2012/074593
§ 371 (c)(1),
(2) Date: Mar. 28, 2014

(87) PCT Pub. No.: WO2013/047533
PCT Pub. Date: Apr. 4, 2013

(65) Prior Publication Data
US 2014/0239359 A1  Aug. 28, 2014

(30) Foreign Application Priority Data

Sep. 29, 2011 (JP) ................................. 2011-215473

(51) Int. Cl.
*H01L 23/495* (2006.01)
*H01L 29/41* (2006.01)
*H01L 23/00* (2006.01)
(Continued)

(52) U.S. Cl.
CPC ................ *H01L 29/41* (2013.01); *H01L 24/48* (2013.01); *H01L 23/49562* (2013.01); *H01L 23/49575* (2013.01); *H01L 29/41725* (2013.01); *H01L 29/4232* (2013.01); *H01L 29/78* (2013.01); *H01L 2224/48247* (2013.01);
(Continued)

(58) Field of Classification Search
CPC ............ H01L 23/367; H01L 23/49541; H01L 23/495; H01L 29/41; H01L 29/41725
USPC .......................... 257/666, 667, 676, 288, 724
See application file for complete search history.

(56) References Cited

U.S. PATENT DOCUMENTS 8,581,376 B2 * 11/2013 Yilmaz et al. ................. 257/676
8,723,300 B2 *  5/2014 Wu et al. ....................... 257/676
(Continued)

FOREIGN PATENT DOCUMENTS

| JP | S57-201840 | 12/1982 |
| JP | 63-170961 | 11/1988 |
| JP | 2004-260205 | 9/2004 |
| JP | 2007-251218 | 9/2007 |
| JP | 2008-108886 | 5/2008 |
| JP | 2009-158673 | 7/2009 |

OTHER PUBLICATIONS

International Search Report for PCT/JP2012/074593, mailed Nov. 13, 2012.
Written Opinion of the ISA (w/ Eng. Translation) for PCT/JP2012/074593, mailed Nov. 13, 2012.

*Primary Examiner* — Nathan Ha
(74) *Attorney, Agent, or Firm* — Nixon & Vanderhye, P.C.

(57) ABSTRACT

A gate electrode (4) and a source electrode (5) of a semiconductor chip (3) are connected to a gate terminal (7) and a source terminal (9), respectively, via electric conductors (11a and 11b). A portion of the gate terminal (7) which portion is joined to the electric conductor (11a) is close to the gate electrode (4), and a portion of the source terminal (9) which portion is joined to the electric conductor (11b) is close to the source electrode (5).

14 Claims, 3 Drawing Sheets

(51) Int. Cl.
*H01L 29/417* (2006.01)
*H01L 29/423* (2006.01)
*H01L 29/78* (2006.01)

(52) U.S. Cl.
CPC .............. *H01L 2924/30107* (2013.01); *H01L 2224/48137* (2013.01); *H01L 2924/19107* (2013.01)
USPC .......................................... 257/676

(56) References Cited

U.S. PATENT DOCUMENTS

| | | | |
|---|---|---|---|
| 8,796,816 B2* | 8/2014 | Hayashi et al. | 257/532 |
| 2007/0013059 A1* | 1/2007 | Otremba | 257/724 |
| 2013/0241047 A1* | 9/2013 | Omae et al. | 257/712 |

* cited by examiner

SEMICONDUCTOR DEVICE

This application is the U.S national phase of International Application No. PCT/JP2012/074593 filed 25 Sep. 2012 which designated the U.S. and claims priority to JP Patent Application No. 2011-215473 filed 29 Sep. 2011, the entire contents of each of which are hereby incorporated by reference.

TECHNICAL FIELD

The present invention relates to a semiconductor device which includes a power transistor and the like, and particularly relates to a technique to reduce resistance and inductance.

BACKGROUND ART

Power transistors which are mainly used in power supply circuits have conventionally been provided in various electric appliances such as those for use in households, and various packages and modules for such power transistors have been proposed according to purposes. Furthermore, recent environmental awareness has drawn attention to new uses of a power device and a power module each including a power transistor in an electric vehicle, a solar power generation device and a wind power generation device etc. Therefore, such a power device and a power module have been required to be more resistant to high voltages, generate a large current, and become small and lightweight.

Furthermore, in addition to the above requirements, the power device and the power module are also required to improve their switching speed. Therefore, it has been particularly necessary to reduce not only resistance and inductance attributed to wiring in a package but also resistance and inductance attributed to external connection terminals.

In general, packages of the above power device and the like are standardized packages (TO-220 or TO-3P etc.). Since there has conventionally been no need to take resistance and inductance into consideration, a wire bonding connection has been employed for connection between a semiconductor chip and a lead terminal serving as an external connection terminal in a package. For the wire bonding connection, a thin wire (gold or aluminum etc.) has been used.

However, a thin long wire has a large resistance and inductance. Therefore, it is difficult to reduce the resistance and inductance as required at present.

In view of the circumstances, there has been proposed a method of directly connecting the lead terminal and the semiconductor chip without using a thin wire. For example, Patent Literatures 1 and 2 each disclose a method including (i) forming specific bumps on electrodes of a semiconductor chip, (ii) mounting the semiconductor chip on a lead frame, and thereafter (iii) placing lead terminals which have been processed in a shape that can be joined to the bumps of the semiconductor chip to thereby connect the lead terminals to the bumps. According to the method, it is possible to electrically connect the lead terminals and the semiconductor chip with small resistance and inductance.

CITATION LIST

Patent Literature

Patent Literature 1
Japanese Patent Application Publication, Tokukai, No. 2004-260205 A (Publication Date: Sep. 16, 2004)
Patent Literature 2
Japanese Patent Application Publication, Tokukai, No. 2007-251218 A (Publication Date: Sep. 27, 2007)

SUMMARY OF INVENTION

Technical Problem

However, according to the methods disclosed in Patent Literatures 1 and 2, a semiconductor chip that can be used in the methods is limited as compared to a conventional wire bonding connection which employs a thin wire, because, for example, the methods require a processing step of forming the specific bumps on the electrodes of the semiconductor chip. Therefore, the methods cannot be widely used.

Therefore, there has been a demand to realize a reduction in resistance and inductance with a simple connection structure without limiting usable semiconductor chips.

The present invention has been made in view of the above problem, and an object of the present invention is to provide a semiconductor device which has a widely-used and simple connection structure and in which resistance and inductance of a package as a whole are small.

Solution to Problem

In order to attain the object, a semiconductor device in accordance with the present invention is a semiconductor device including: a metal plate; one semiconductor element provided on the metal plate; and at least three lead terminals electrically connected to the semiconductor element, the semiconductor element having at least one electrode on its first surface and being provided on the metal plate so that a second surface opposite to the first surface faces the metal plate, the lead terminals being provided so as not to overlap the semiconductor element, the at least one electrode on the first surface of the semiconductor element being connected to one of or different ones of the lead terminals via an electric conductor or respective electric conductors, and a joined portion of the one of or each of the different ones of the lead terminals being close to the at least one electrode, the joined portion being joined to the electric conductor or a corresponding one of the electric conductors via which the at least one electrode and the one of or the different ones of the lead terminals are connected to each other.

According to the configuration, a joined portion of a lead terminal, which portion is joined to an electric conductor via which the lead terminal and a corresponding electrode are connected to each other, is positioned close to the corresponding electrode. This makes it possible to shorten the electric conductors via which the lead terminals and the electrodes are connected to each other, thereby reducing resistance and inductance of the electric conductors.

Furthermore, unlike a conventional electric conductor, each of the electric conductors does not need to be provided so as to form a loop in a circular arc. Therefore, electric conductors each having a larger cross-section can be used. Accordingly, it is possible to further reduce resistance and inductance of the electric conductors.

Furthermore, a connecting step using the electric conductors is substantially the same as a conventional connecting step (e.g., wire-bonding step). Therefore, no additional step is needed. Furthermore, the connecting step using the electric conductors is applicable to a semiconductor element having usual electrodes.

As such, according to the semiconductor device, it is possible, with a widely-used simple connection structure, to reduce resistance and inductance of a package of the semiconductor device as a whole.

In order to attain the object, a semiconductor device in accordance with the present invention is a semiconductor device including: a metal plate; a plurality of semiconductor elements provided on the metal plate; and at least three lead terminals electrically connected to the plurality of semiconductor elements, the plurality of semiconductor elements having at least one electrode on each of their first surfaces and being provided on the metal plate so that second surfaces opposite to the first surfaces face the metal plate, the lead terminals being provided so as not to overlap the plurality of semiconductor elements, at least one of all the electrodes on the first surfaces of the plurality of semiconductor elements being connected to one of or different ones of the lead terminals via an electric conductor or respective electric conductors, and a joined portion of the one of or each of the different ones of the lead terminals being close to the at least one of all the electrodes, the joined portion being joined to the electric conductor or a corresponding one of the electric conductors via which the at least one of all the electrodes and the one of or the different ones of the lead terminals are connected to each other.

According to the configuration, a joined portion of a lead terminal, which portion is joined to an electric conductor via which the lead terminal and a corresponding electrode are connected to each other, is positioned close to the corresponding electrode. This makes it possible to shorten the electric conductors via which the lead terminals and the electrodes are connected to each other, thereby reducing resistance and inductance of the electric conductors.

Furthermore, unlike a conventional electric conductor, each of the electric conductors does not need to be provided so as to form a loop in a circular arc. Therefore, electric conductors each having a larger cross-section can be used. Accordingly, it is possible to further reduce resistance and inductance of the electric conductors.

Furthermore, a connecting step using the electric conductors is substantially the same as a conventional connecting step (e.g., wire-bonding step). Therefore, no additional step is needed. Furthermore, the connecting step using the electric conductors is applicable to a semiconductor element having usual electrodes.

As such, even in the case of a structure which has more connections because of the plurality of semiconductor elements, it is possible, with a widely-used simple connection structure, to reduce resistance and inductance of a package of the semiconductor device as a whole.

Advantageous Effects of Invention

As has been described, a semiconductor device in accordance with the present invention is configured such that the at least one electrode on the first surface of the semiconductor element is connected to one of or different ones of the lead terminals via an electric conductor or respective electric conductors, and a joined portion of the one of or each of the different ones of the lead terminals is close to the at least one electrode, the joined portion is joined to the electric conductor or a corresponding one of the electric conductors via which the at least one electrode and the one of or the different ones of the lead terminals are connected to each other. Therefore, it is possible, with a widely-used simple connection structure, to reduce resistance and inductance of a package of the semiconductor device as a whole.

Figure 2:
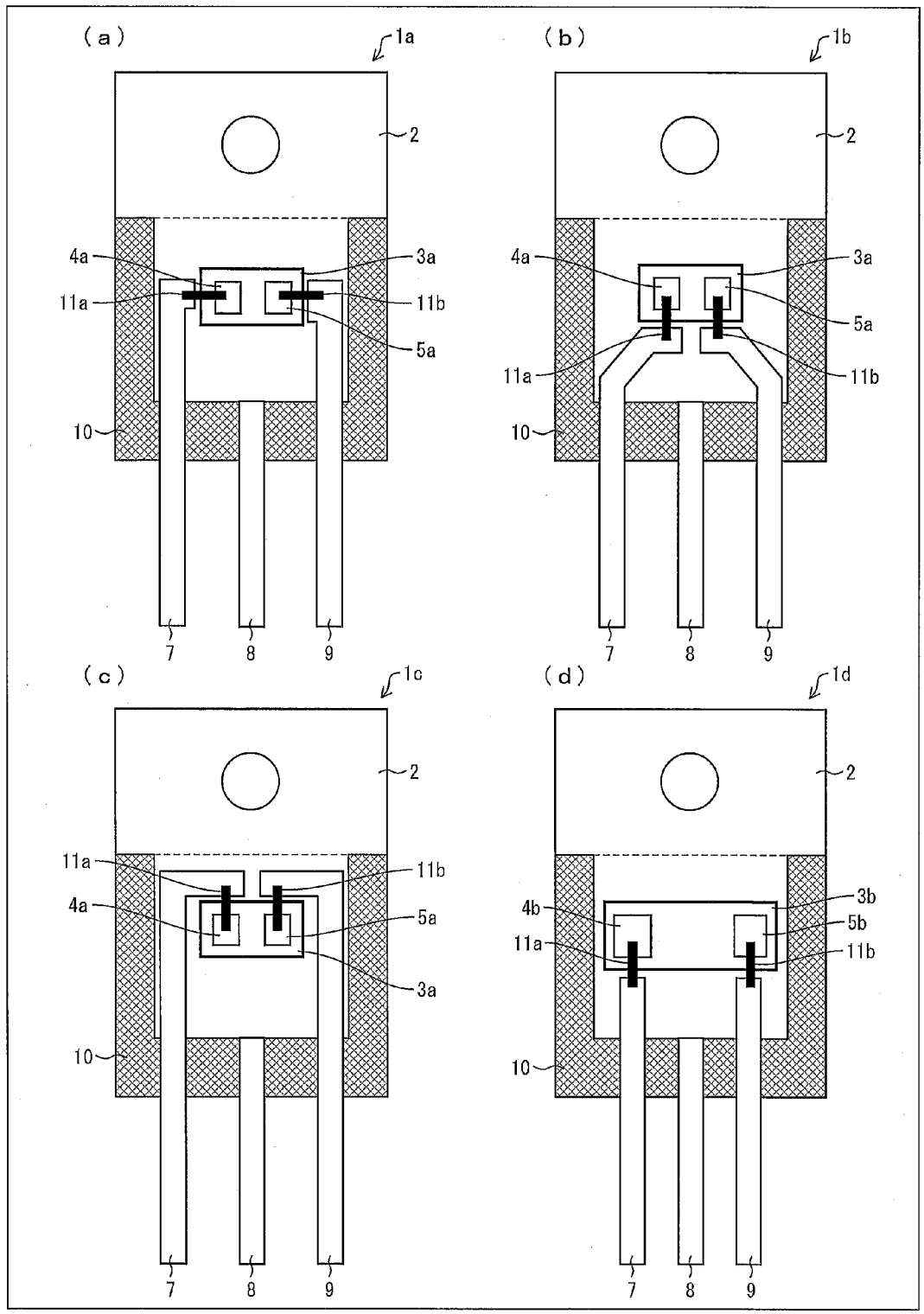

(a) to (d) of FIG. 2 illustrate other examples of a configuration of the semiconductor device.

Figure 3:
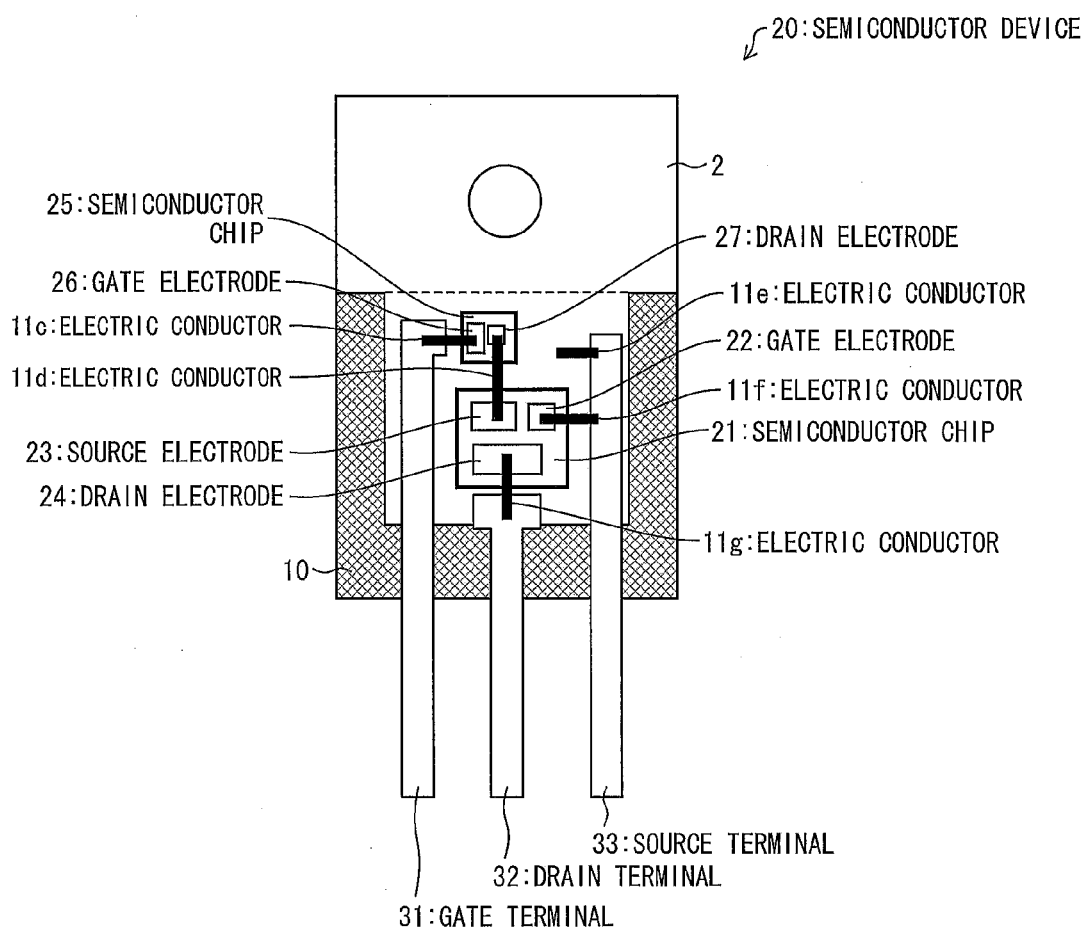

FIG. 3 schematically illustrates a configuration of a semiconductor device in accordance with another embodiment of the present invention.

DESCRIPTION OF EMBODIMENTS

In each embodiment below, a power transistor such as a MOSFET is discussed. A semiconductor device including such a power transistor has a standardized package. A semiconductor device which has a package conforming to the TO-220 standard product is taken as an example here, but the package is not limited to such.

[Embodiment 1]

One embodiment of the present invention is discussed below with reference to the drawings.

(Schematic Configuration of Semiconductor Device)

Figure 1:
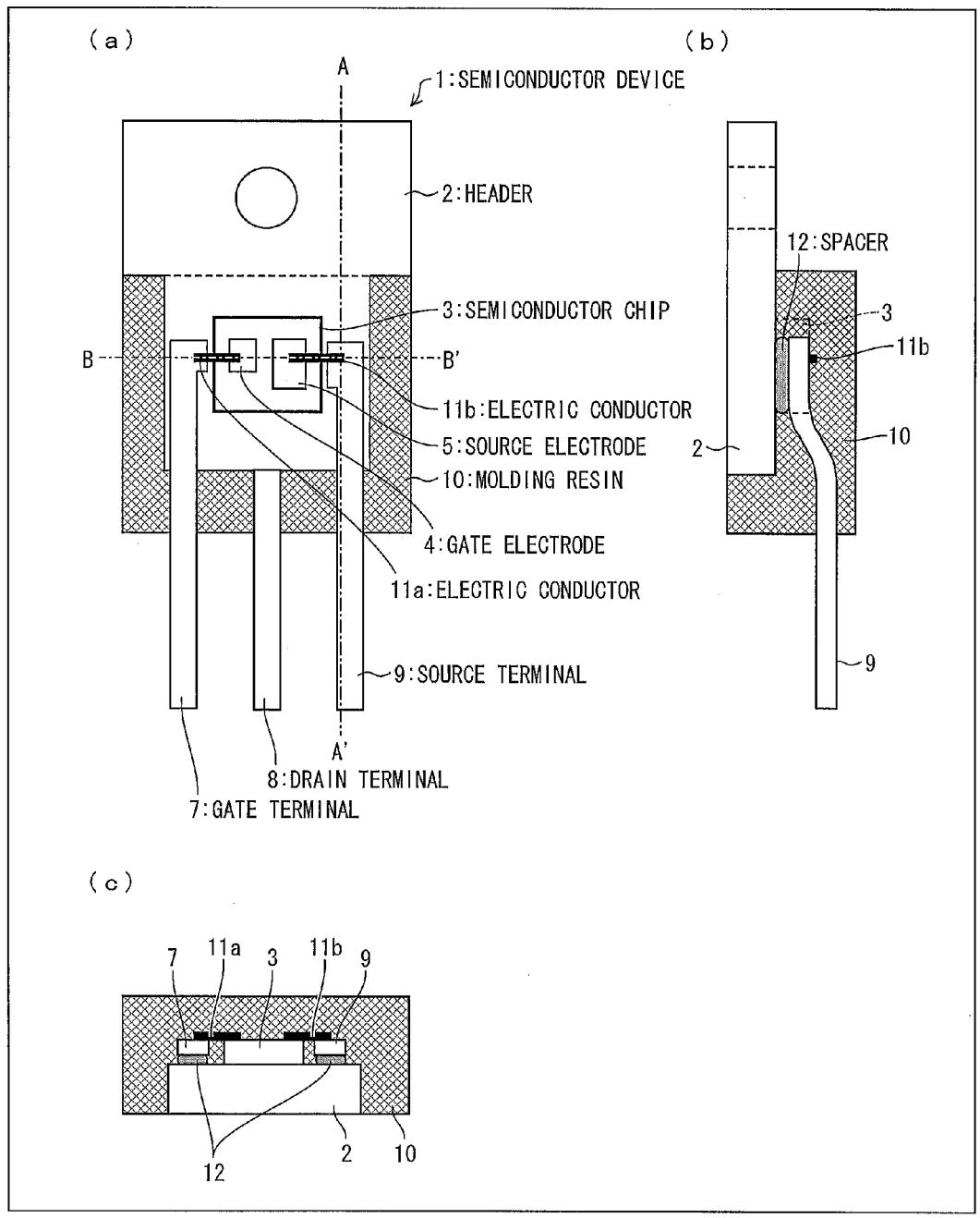
FIG. 1 schematically illustrates a configuration of a semiconductor device in accordance with one embodiment of the present invention. (a) of FIG. 1 is a plan view, (b) of FIG. 1 is a cross-sectional view taken along the line A-A' shown in (a) of FIG. 1, and (c) of FIG. 1 is a cross-sectional view taken along the line B-B' shown in (a) of FIG. 1.

FIG. 1 schematically illustrates one example of a configuration of a semiconductor device 1 of the present embodiment. (a) of FIG. 1 is a plan view, (b) of FIG. 1 is a cross-sectional view taken along the line A-A' shown in (a) of FIG. 1, and (c) of FIG. 1 is a cross-sectional view taken along the line B-B' shown in (a) of FIG. 1. Note that, in (a) of FIG. 1, part of the semiconductor device 1 is seen through a molding resin 10.

As illustrated in FIG. 1, the semiconductor device 1 includes a header (metal plate) 2, a semiconductor chip (semiconductor element) 3, a gate terminal (third lead terminal) 7, a drain terminal (first lead terminal) 8, a source terminal (second lead terminal) 9, the molding resin (sealing resin) 10, and spacers 12. The semiconductor device 1 conforms to the TO-220 standard product.

The header 2 is a plate-like base made of metal (copper or aluminum etc.). The header 2 has, on one surface (hereinafter referred to as a top surface), the semiconductor chip 3, the gate terminal 7, the drain terminal 8, the source terminal 9, the molding resin 10, and the spacers 12. The header 2's opposite surface (hereinafter referred to as a bottom surface), which is opposite to the one surface of the header 2, is exposed.

The semiconductor chip 3 is a semiconductor element in which a power device (e.g., MOSFET) having a gate electrode 4, a source electrode 5, and a drain electrode is provided. The gate electrode 4 and the source electrode 5 are provided on one surface (first surface, hereinafter referred to as a top surface) of the semiconductor chip 3, and the drain electrode is provided on a surface (second surface, hereinafter referred to as a bottom surface) opposite to the one surface of the semiconductor chip 3.

The semiconductor chip 3 is provided on the header 2 such that the bottom surface of the semiconductor chip 3 faces the header 2. The semiconductor chip 3 is fixed to the header 2 by, for example, die bonding etc. This provides an electrical connection between the drain electrode of the semiconductor chip 3 and the header 2.

The gate terminal 7, the drain terminal 8, and the source terminal 9 are lead terminals made of metal (copper or aluminum etc.). The gate terminal 7, the drain terminal 8, and the source terminal 9 are arranged parallel to each other in a plan view as illustrated in (a) of FIG. 1. The gate terminal 7 is electrically connected to the gate electrode 4 of the semiconductor chip 3. The drain terminal 8 is electrically connected to the header 2, i.e., the drain electrode of the semiconductor chip 3. The source terminal 9 is electrically connected to the source electrode 5 of the semiconductor chip 3. How the gate terminal 7, the drain terminal 8, and the source terminal 9 are connected within a package will be discussed later in detail.

The spacers 12 are provided in the following two positions: a position between the gate terminal 7 and the header 2; and a position between the source terminal 9 and the header 2. The spacers 12 function as supports (to ensure strength during bonding) for the gate terminal 7 and the source terminal 9. The spacers 12 are made of, for example, thermosetting epoxy resin, but not particularly limited to such, provided that the spacers 12 can ensure enough strength as the supports and are made of an insulating solid material.

The molding resin 10 is an insulating resin (e.g., black resin) which seals therein part of the header 2, the semiconductor chip 3, part of the gate terminal 7, part of the drain terminal 8, part of the source terminal 9, and the spacers 12. The gate terminal 7, the drain terminal 8, and the source terminal 9 protrude from one lateral surface of the molding resin 10 so as to function as terminals (external connection terminals) that are connectable to outside.

(Connection of Lead Terminals)

The following description discusses in detail how the gate terminal 7, the drain terminal 8, and the source terminal 9 are connected within the package. Note that, hereinafter, a vertical direction of (b) of FIG. 1 and a horizontal direction of (c) of FIG. 1 are each referred to as a "plane direction", and a horizontal direction of (b) of FIG. 1 and a vertical direction of (c) of FIG. 1 are each referred to as a "height direction".

The three lead terminals (the gate terminal 7, the drain terminal 8, and the source terminal 9) are arranged such that their parts located outside the molding resin 10 are in a predetermined arrangement (along the plane direction and the height direction). For example, along the plane direction, the parts of the respective three lead terminals which parts are located outside the molding resin 10 are arranged at intervals that conform to the standard. Meanwhile, along the height direction, when the bottom surface of the header 2 serves as a reference, the parts of the three lead terminals which parts are located outside the molding resin 10 are farther away from the bottom surface of the header 2 than the top surface of the header 2 and the top surface of the semiconductor chip 3 are, i.e., positioned higher than the upper surface of the header 2 and the top surface of the semiconductor chip 3.

Therefore, the positions and shapes of the three lead terminals are specially designed and components (the spacers 12) are added in the molding resin 10 so that the three lead terminals are optimally connected to the header 2 and the electrodes of the semiconductor chip 3.

The drain terminal 8 is directly connected to the header 2 with, for example, solder. Therefore, the drain terminal 8 is bent in the molding resin 10 so that (i) a portion (one end) of the drain terminal 8 which portion is joined to the header 2 and (ii) the top surface of the header 2 are even with each other.

The gate terminal 7 and the source terminal 9 have similar connection structures which use electric conductors 11a and 11b. Specifically, the gate terminal 7 is connected to the gate electrode 4 of the semiconductor chip 3 via the electric conductor 11a, and the source terminal 9 is connected to the source electrode 5 of the semiconductor chip 3 via the electric conductor 11b.

The electric conductors 11a and 11b can be metal wires. Note that the metal wires, which constitute the electric conductors 11a and 11b, are not thin long metal wires for use in conventional wire bonding, but thick short metal wires. Therefore, each of the electric conductors 11a and 11b has a circular or elliptical cross section larger in area than that of a conventional metal wire. Note, however, that the electric conductors 11a and 11b are not limited to relatively flexible metal wires like above, and may be thick, short, plate-like metals each having a polygonal cross section. The electric conductors 11a and 11b can be made of any of a variety of general materials which have been conventionally used. In consideration of resistance and production costs, it is preferable that the electric conductors 11a and 11b each have a circular, elliptical or quadrangular cross section and are each made of copper or aluminum.

In a case where such metal wires are used as the electric conductors 11a and 11b, connections are made by ultrasonic bonding. In a case where plate-like metals are used as the electric conductors 11a and 11b, connections are made with adhesive paste (mainly solder paste).

Therefore, according to the semiconductor device 1 in which the electric conductors 11a and 11b are employed, no special processing step is required for connection of the semiconductor chip 3 unlike a conventional semiconductor device. Thus, the semiconductor device 1 can be produced by the same process as a conventional package because a semiconductor chip produced as a widely-used product can be used as it is, and the semiconductor device 1 can be used for various purposes.

Furthermore, in a plan view, a portion (one end) of the gate terminal 7 which portion is joined to the electric conductor 11a does not overlap the semiconductor chip 3 but is positioned close to the gate electrode 4 of the semiconductor chip 3. Furthermore, in a plan view, a portion (one end) of the source terminal 9 which portion is connected to the electric conductor 11b does not overlap the semiconductor chip 3 but is positioned close to the source electrode 5 of the semiconductor chip 3. This makes it possible to shorten (reduce the length along the plane direction of) the electric conductors 11a and 11b.

Specifically, the gate terminal 7 is extended close to the gate electrode 4 of the semiconductor chip 3 so that the length of the electric conductor 11a is as short as possible. Furthermore, the source terminal 9 is extended close to the source electrode 5 of the semiconductor chip 3 so that the length of the electric conductor 11b is as short as possible. Note, however, that the semiconductor chip 3 is not in contact with but is at a distance from the gate terminal 7 and the source terminal 9 provided close to the semiconductor chip 3. The reason therefor is discussed below.

A process for producing the semiconductor device 1 includes (i) a mounting step by which to bond the semiconductor chip 3 to the header 2, (ii) a connecting step by which to connect the semiconductor chip 3 to the three lead terminals, and (iii) a sealing step by which to form the molding resin 10 and seal the semiconductor chip 3 etc. in the molding resin 10. The three lead terminals are integrally provided in the form of a lead frame before the mounting step, and, in the mounting step, the semiconductor chip 3 is mounted on the header 2 on which the lead frame is placed.

Therefore, in consideration of mounting displacement of the semiconductor chip 3, the positions of the lead terminals are designed so that the lead terminals do not interfere with the semiconductor chip 3 (the lead terminals have a shape that does not obstruct when the semiconductor chip 3 is mounted). The mounting displacement of the semiconductor chip 3 depends on accuracy of a device (die bonder) which mounts the semiconductor chip 3 on the header 2 and the shape of a jig (collet) which picks up the semiconductor chip 3. Note that the lead frame is cut after the sealing step, thereby being provided as the three lead terminals.

In the arrangement, a distance between the gate electrode 4 and the gate terminal 7 which are connected via the electric conductor 11a along the plane direction is the shortest possible distance determined in consideration of mounting displacement of the semiconductor chip 3. Furthermore, a distance between the source electrode 5 and the source terminal 9 which are connected via the electric conductor 11b along the plane direction is the shortest possible distance determined in consideration of the mounting displacement of the semiconductor chip 3.

Meanwhile, in the height direction, (i) a portion of the gate terminal 7 which portion is joined to the electric conductor 11a and (ii) a portion (the top surface of the semiconductor chip 3) of the gate electrode 4 of the semiconductor chip 3 which portion is joined to the electric conductor 11a are even with each other. That is, the gate terminal 7 is bent in the molding resin 10 so that (i) the portion of the gate terminal 7 which portion is joined to the electric conductor 11a and (ii) the portion of the gate electrode 4 of the semiconductor chip 3 which portion is joined to the electric conductor 11a are even with each other.

Also in the height direction, (i) a portion of the source terminal 9 which portion is joined to the electric conductor 11b and (ii) a portion (the top surface of the semiconductor chip 3) of the source electrode 5 of the semiconductor chip 3 which portion is joined to the electric conductor 11b are even with each other. That is, the source terminal 9 is bent in the molding resin 10 so that (i) the portion of the source terminal 9 which portion is joined to the electric conductor 11b and (ii) the portion of the source electrode 5 of the semiconductor chip 3 which portion is joined to the electric conductor 11b are even with each other (see (b) of FIG. 1).

As described above, (i) a surface of the gate electrode 4 of the semiconductor chip 3 which surface is joined to the electric conductor 11a and (ii) a surface of the gate terminal 7 which surface is joined to the electric conductor 11a are even with each other, and (a) a surface of the source electrode 5 of the semiconductor chip 3 which surface is joined to the electric conductor 11b and (b) a surface of the source terminal 9 which surface is joined to the electric conductor 11b are even with each other. This makes it possible to form the electric conductors 11a and 11b of a simple shape, particularly a linear shape (i.e., linear electric conductors can be employed). Therefore, it is possible to employ the shortest possible electric conductors 11a and 11b.

Note that, as described earlier, the gate terminal 7 and the source terminal 9 are supported by the header 2 via the spacers 12. The spacers 12 are respectively provided under the portion of the gate terminal 7 which portion is joined to the electric conductor 11a and under the portion of the source terminal 9 which portion is joined to the electric conductor 11b. Accordingly, the spacers 12 can also serve to help adjust the vertical positions of the gate terminal 7 and the source terminal 9.

Furthermore, even in a case where the lead terminals are not strong enough because they are made of, for example, copper which has a low electric resistance, it is possible to connect the electrodes of the semiconductor chip 3 and the lead terminals via the electric conductors 11a and 11b each of which has a large cross-sectional area while maintaining the vertical positions of the lead terminals. This can be realized because the spacers 12 and the header 2 can support the lead terminals (so as to ensure strength).

As has been described, according to the semiconductor device 1, it is possible to employ the shortest possible electric conductors 11a and 11b. This makes it possible to reduce resistance and inductance of the electric conductors 11a and 11b to as small as possible.

Furthermore, a connecting step using the electric conductors 11a and 11b is substantially the same as a conventional connecting step (e.g., wire-bonding step). Therefore, no additional step is needed. Furthermore, the connecting step using the electric conductors 11a and 11b is applicable to a semiconductor chip having usual electrodes. As such, according to the semiconductor device 1, it is possible, with a widely-used simple connection structure, to reduce resistance and inductance of a package as a whole.

The semiconductor device 1 is configured such that (i) the surface of the gate electrode 4 which surface is joined to the electric conductor 11a and (ii) the surface of the gate terminal 7 which surface is joined to the electric conductor 11a are even with each other and (a) the surface of the source electrode 5 which surface is joined to the electric conductor 11b and (b) the surface of the source terminal 9 which surface is joined to the electric conductor 11b are even with each other. Note, here, that the term "even" not only means exactly even but also means states that can be regarded as even ("substantially even"). Furthermore, with regard to the electric conductors 11a and 11b in linear shape, the definition of the term "linear" not only includes a state in which the electric conductors 11a and 11b are exactly linear but also includes states which can be regarded as linear ("substantially linear").

Although it is preferable that each set of connection surfaces are even with each other, it is not always necessary that each set of connection surfaces be even with each other. That is, it is evident that the lengths of the electric conductors of the present embodiment can be made shorter than those of conventional thin long wires by providing the lead terminals close to the semiconductor chip like above. This makes it possible to reduce resistance and inductance. Furthermore, unlike a conventional electric conductor, each of the electric conductors used in the present embodiment is not required to be provided so as to form a loop in a circular arc. Therefore, electric conductors each having a larger cross-section can be used. Accordingly, it is possible to further reduce resistance and inductance.

Note that, although the semiconductor device 1 includes the spacers 12, the spacers 12 can be omitted in a case where the lead terminals themselves can ensure strength when the electrodes (gate electrode 4 and source electrode 5) of the semiconductor chip 3 and the lead terminals (gate terminal 7 the source terminal 9) are connected to each other via the electric conductors (electric conductors 11a and 11b).

MODIFIED EXAMPLES (a) to (d) of FIG. 2 schematically illustrate configurations of semiconductor devices 1a through 1d which are modified examples of the semiconductor device 1.

Each of the semiconductor devices 1a through 1c is different from the semiconductor device 1 in that the semiconductor devices 1a through 1c each include a semiconductor chip 3a instead of the semiconductor chip 3 (see (a) through (c) of FIG. 2). The semiconductor chip 3a has a gate electrode 4a and a source electrode 5a on its top surface, and the gate electrode 4a and the source electrode 5a are each positioned at equal distances from three adjacent lateral surfaces of the semiconductor chip 3a. Therefore, there are three ways of arranging the gate terminal 7 and the source terminal 9.

(a) of FIG. 2 illustrates an arrangement in which the gate terminal 7 and the source terminal 9 are provided such that the semiconductor chip 3a is positioned between the gate terminal 7 and the source terminal 9. This arrangement is the most basic arrangement.

(b) of FIG. 2 illustrates an arrangement in which the gate terminal 7 and the source terminal 9 are bent in the molding resin 10 in front of the semiconductor chip 3a whereby the gate terminal 7 and the source terminal 9 are connected to the semiconductor chip 3a on the same lateral surface-side of the semiconductor chip 3a (in front of the semiconductor chip 3a). The gate terminal 7 and the source terminal 9 are each preferably bent at an angle of approximately 45 degrees.

(c) of FIG. 2 illustrates an arrangement in which the gate terminal 7 and the source terminal 9 are bent in the molding resin 10 so they surround three of the four sides of the semiconductor chip 3a, whereby the gate terminal 7 and the source terminal 9 are connected to the semiconductor chip 3a on the same lateral surface-side of the semiconductor chip 3a (behind the semiconductor chip 3a).

The semiconductor device 1d is different from the semiconductor device 1 in that the semiconductor device 1d includes a semiconductor chip 3b instead of the semiconductor chip 3 (see (d) of FIG. 2). The semiconductor chip 3b has a gate electrode 4b and a source electrode 5b on its top surface, and the gate electrode 4b and the source electrode 5b are each positioned at equal distances from three adjacent lateral surfaces of the semiconductor chip 3b. Note, however, that the semiconductor chip 3b is larger than the semiconductor chips 3 and 3a.

With the arrangement, there is not enough space for the gate terminal 7 and the source terminal 9 to be provided on both sides of the semiconductor chip 3b. Therefore, it is preferable that the gate terminal 7 and the source terminal 9 are not bent and are positioned on the same lateral surface-side (in front) of the semiconductor chip 3b.

Of the semiconductor devices 1a through 1d, in terms of reductions in resistance and inductance of a package as a whole, the relative positions of constituents of the semiconductor device 1d are good because conductors (lead terminals etc.) in the package are the shortest. The second best are the arrangements of the semiconductor devices 1a and 1b. Note that the arrangement of the semiconductor device 1c is less likely to be employed in a package which includes only one semiconductor chip (an arrangement in which a plurality of semiconductor chips are provided is discussed later).

Therefore, in a case where there are a plurality of arrangement patterns in which the electric conductors 11a and 11b are the shortest, it is preferable to decide which arrangement pattern to employ, in consideration of the following point(s): "the lead terminals are also as short as possible (to prevent an increase in resistance and inductance)"; and/or "the lead terminals have a minimum number of bends (to prevent an increase in inductance)". The arrangement is determined in view of, for example, "directions in which the lead terminals extend", "distance between the lead terminals", "shape and position of a semiconductor chip", and "positions of electrodes of the semiconductor chip". In particular, "shape (size) of a semiconductor chip" and "positions of electrodes of the semiconductor chip" are important factors.

[Embodiment 2]

The semiconductor device 1 of the aforesaid Embodiment 1 is constituted by a single package including one semiconductor chip 3, but the number of semiconductor chips is not limited to such. It is also possible to employ an arrangement in which a plurality of semiconductor chips are included in one package. The present embodiment discusses, as one example, an arrangement in which two electrically-connected semiconductor chips are provided in one package.

Note that the present embodiment is the same as Embodiment 1 except for configurations described below. Therefore, for convenience of description, members having functions identical to those illustrated in the drawings of Embodiment 1 are assigned identical referential numerals, and their descriptions are omitted here as appropriate.

FIG. 3 illustrates one example of a configuration of a semiconductor device 20 of the present embodiment. Note that, in FIG. 3, part of the semiconductor device 20 can be seen through a molding resin 10.

The semiconductor device 20 includes, as illustrated in FIG. 3, a header 2, semiconductor chips (first semiconductor chip and second semiconductor chip) 21 and 25, a gate terminal (third lead terminal) 31, a drain terminal (first lead terminal) 32, a source terminal (second lead terminal) 33, the molding resin 10, and spacers 12 (not illustrated). The semiconductor device 20 conforms to the TO-220 standard product, and the external appearance of the semiconductor device 20 is the same as that of the semiconductor device 1 of Embodiment 1.

The semiconductor chip 21 is a semiconductor element in which an N-channel power transistor (e.g., GaN) having a gate electrode 22, a source electrode 23, and a drain electrode 24 is provided. The gate electrode 22, the source electrode 23, and the drain electrode 24 are provided on one surface (first surface, hereinafter referred to as a top surface) of the semiconductor chip 21.

The semiconductor chip 25 is a semiconductor element in which an N-channel power transistor (e.g., MOSFET) having a gate electrode 26, a source electrode, and a drain electrode 27 is provided. The gate electrode 26 and the drain electrode 27 are provided on one surface (first surface, hereinafter referred to as a top surface) of the semiconductor chip 25, and the source electrode is provided on a surface (second surface, hereinafter referred to as a bottom surface) opposite to the one surface of the semiconductor chip 25.

The semiconductor chips 21 and 25 are placed on the header 2 and are fixed to the header 2 with, for example, electrically conductive paste (solder paste etc.) or an insulating sheet such that bottom surfaces of the semiconductor chips 21 and 25 face the header 2. With this arrangement, the source electrode of the semiconductor chip 25 is electrically connected to the header 2.

The gate terminal 31, the drain terminal 32, and the source terminal 33 are lead terminals made of metal (copper or aluminum etc.). The gate terminal 31, the drain terminal 32, and the source terminal 33 are arranged parallel to each other in a plan view (see FIG. 3). The gate terminal 31, the drain terminal 32, and the source terminal 33 are electrically connected to the semiconductor chips 21 and 25.

Note, here, that the semiconductor chips 21 and 25 are connected in cascode. Specifically, the semiconductor chip 21 has the drain electrode 24 electrically connected to the drain terminal 32, the source electrode 23 electrically connected to the drain electrode 27 of the semiconductor chip 25, and the gate electrode 22 electrically connected to the source terminal 33. The semiconductor chip 25 has the source electrode electrically connected to the header 2 and the gate electrode 26 connected to the gate terminal 31.

Furthermore, an electrical connection between (i) the gate terminal 31, the drain terminal 32, and the source terminal 33 and (ii) electrodes of the semiconductor chips 21 and 25 is equivalent to that of the gate terminal 7 and the source terminal 9 of the semiconductor device 1 of Embodiment 1. That is, the gate terminal 31 is connected to the gate electrode 26 of the semiconductor chip 25 via an electric conductor 11c, the drain terminal 32 is connected to the drain electrode 24 of the semiconductor chip 21 via an electric conductor 11g, and the source terminal 33 is connected to the gate electrode 22 of the semiconductor chip 21 via an electric conductor 11f.

The gate terminal 31, the drain terminal 32 and the source terminal 33 are so shaped and arranged along the plane direction and the height direction that the electric conductors 11c, 11g, and 11f have the shortest possible lengths, as described earlier. Note that the spacers 12 are provided under the gate terminal 31, the drain terminal 32, and the source terminal 33, but the spacers 12 can be omitted as necessary.

Furthermore, the source electrode 23 of the semiconductor chip 21 and the drain electrode 27 of the semiconductor chip 25 are connected to each other via an electric conductor 11d. Furthermore, the source terminal 33 is connected to the header 2 via an electric conductor 11e. With this arrangement, the source terminal 33 is electrically connected to the source electrode of the semiconductor chip 25. Note that the source terminal 33 and the header 2 can be electrically connected together with solder without the electric conductor 11e.

The electric conductors 11c through 11g have the same configurations (material and shape) as the electric conductors 11a and 11b of Embodiment 1.

Usually, an arrangement in which two semiconductor chips 21 and 25 are provided has more connections. This results in an increase of resistance.

In this regard, the semiconductor device 20 arranged like above employs a connection structure that minimizes resistance and inductance. With this arrangement, it is possible to provide a high-performance power device in which resistance and inductance of a package as a whole are small.

Furthermore, the connection structure like above, which employs electric conductors, is also applicable to a case where three or more semiconductor chips are provided in one package, and this brings about a similar effect.

Note that, although each embodiment discussed an arrangement which includes three lead terminals corresponding to a gate, a drain and a source, respectively, the number of lead terminals is not limited to three. That is, there are various packages for power transistors, and therefore the shapes of the packages and the number of lead terminals widely vary. Accordingly, four or more lead terminals can be provided depending on a package etc. That is, the arrangement is not limited, provided that at least three lead terminals are provided in correspondence with a gate, a drain and a source, respectively.

The present invention is not limited to the description of the embodiments above, but may be altered by a skilled person within the scope of the claims. An embodiment based on a proper combination of technical means disclosed in different embodiments is encompassed in the technical scope of the present invention.

[Closing]

As has been described, a semiconductor device in accordance with the present invention is a semiconductor device including: a metal plate; one semiconductor element provided on the metal plate; and at least three lead terminals electrically connected to the semiconductor element, the semiconductor element having at least one electrode on its first surface and being provided on the metal plate so that a second surface opposite to the first surface faces the metal plate, the lead terminals being provided so as not to overlap the semiconductor element, the at least one electrode on the first surface of the semiconductor element being connected to one of or different ones of the lead terminals via an electric conductor or respective electric conductors, and a joined portion of the one of or each of the different ones of the lead terminals being close to the at least one electrode, the joined portion being joined to the electric conductor or a corresponding one of the electric conductors via which the at least one electrode and the one of or the different ones of the lead terminals are connected to each other.

According to the configuration, a joined portion of a lead terminal, which portion is joined to an electric conductor via which the lead terminal and a corresponding electrode are connected to each other, is positioned close to the corresponding electrode. This makes it possible to shorten the electric conductors via which the lead terminals and the electrodes are connected to each other, thereby reducing resistance and inductance of the electric conductors.

Furthermore, unlike a conventional electric conductor, each of the electric conductors does not need to be provided so as to form a loop in a circular arc. Therefore, electric conductors each having a larger cross-section can be used. Accordingly, it is possible to further reduce resistance and inductance of the electric conductors.

Furthermore, a connecting step using the electric conductors is substantially the same as a conventional connecting step (e.g., wire-bonding step). Therefore, no additional step is needed. Furthermore, the connecting step using the electric conductors is applicable to a semiconductor element having usual electrodes.

As such, according to the semiconductor device, it is possible, with a widely-used simple connection structure, to reduce resistance and inductance of a package of the semiconductor device as a whole.

Furthermore, the semiconductor device in accordance with the present invention is preferably configured such that the at least one electrode is connected to the one of or the different ones of the lead terminals via the electric conductor or the respective electric conductors such that a joined portion(s), which is/are joined to the electric conductor or the respective electric conductors, of the at least one electrode is/are even with a joined portion(s), which is/are joined to the electric conductor or the respective electric conductors, of the one of or the different ones of the lead terminals.

According to the configuration, the electric conductors can be arranged in straight lines. This makes it possible to employ the shortest possible electric conductors, and thus possible to reduce resistance and inductance of the electric conductors to as small as possible.

Furthermore, the semiconductor device in accordance with the present invention can also be configured such that the electric conductor or the respective electric conductors has/have a linear shape.

Furthermore, the semiconductor device in accordance with the present invention can also be configured such that a distance between each of the at least one electrode and a corresponding one of the lead terminals, which are connected to each other via the electric conductor or a corresponding one of the electric conductors, is a shortest possible distance determined in consideration of mounting displacement of the semiconductor element.

Furthermore, the semiconductor device in accordance with the present invention can also be configured such that the semiconductor element further has at least one electrode on the second surface.

Furthermore, the semiconductor device in accordance with the present invention can also be configured such that the one of or the different ones of the lead terminals connected to the electric conductor or the respective electric conductors functions/function as a terminal(s) connectable to outside.

Furthermore, the semiconductor device in accordance with the present invention preferably further includes an insulating spacer, wherein the one of or the different ones of the lead terminals connected to the electric conductor or the respective electric conductors is/are each supported on the metal plate via the spacer.

According to the configuration, even in a case where the lead terminals are not strong enough, it is possible to connect the electrodes of the semiconductor chip and the lead terminals via the electric conductors while maintaining the vertical positions of the lead terminals. This can be realized because the spacers and the metal plate can support the lead terminals.

Furthermore, the semiconductor device in accordance with the present invention can also be configured to further includes a sealing resin for sealing at least the semiconductor element, wherein one part of the one of or each of the different ones of the lead terminals connected to the electric conductor or the respective electric conductors is within the sealing resin, the part including the joined portion of the one of or each of the different ones of the lead terminals, and the other part is outside the sealing resin.

Furthermore, the semiconductor device in accordance with the present invention can also be configured such that the semiconductor element includes a power transistor having a drain electrode, a source electrode, and a gate electrode; and the lead terminals are a first lead terminal electrically connected to the drain electrode, a second lead terminal electrically connected to the source electrode, and a third lead terminal electrically connected to the gate electrode.

The semiconductor device in accordance with the present invention is a semiconductor device including: a metal plate; a plurality of semiconductor elements provided on the metal plate; and at least three lead terminals electrically connected to the plurality of semiconductor elements, the plurality of semiconductor elements having at least one electrode on each of their first surfaces and being provided on the metal plate so that second surfaces opposite to the first surfaces face the metal plate, the lead terminals being provided so as not to overlap the plurality of semiconductor elements, at least one of all the electrodes on the first surfaces of the plurality of semiconductor elements being connected to one of or different ones of the lead terminals via an electric conductor or respective electric conductors, and a joined portion of the one of or each of the different ones of the lead terminals being close to the at least one of all the electrodes, the joined portion being joined to the electric conductor or a corresponding one of the electric conductors via which the at least one of all the electrodes and the one of or the different ones of the lead terminals are connected to each other.

According to the configuration, a joined portion of a lead terminal, which portion is joined to an electric conductor via which the lead terminal and a corresponding electrode are connected to each other, is positioned close to the corresponding electrode. This makes it possible to shorten the electric conductors via which the lead terminals and the electrodes are connected to each other, thereby reducing resistance and inductance of the electric conductors.

Furthermore, unlike a conventional electric conductor, each of the electric conductors does not need to be provided so as to form a loop in a circular arc. Therefore, electric conductors each having a larger cross-section can be used. Accordingly, it is possible to further reduce resistance and inductance of the electric conductors.

Furthermore, a connecting step using the electric conductors is substantially the same as a conventional connecting step (e.g., wire-bonding step). Therefore, no additional step is needed. Furthermore, the connecting step using the electric conductors is applicable to a semiconductor element having usual electrodes.

As such, according to the semiconductor device, even in the case of a structure which has more connections because of the plurality of semiconductor elements, it is possible, with a widely-used simple connection structure, to reduce resistance and inductance of a package of the semiconductor device as a whole.

Furthermore, the semiconductor device in accordance with the present invention is preferably configured such that the at least one of all the electrodes is connected to the one of or the different ones of the lead terminals via the electric conductor or the respective electric conductors such that a joined portion(s), which is/are joined to the electric conductor or the respective electric conductors, of the at least one of all the electrodes is/are even with a joined portion(s), which is/are joined to the electric conductor or the respective electric conductors, of the one of or the different ones of the lead terminals.

According to the configuration, the electric conductors can be arranged in straight lines. This makes it possible to employ the shortest possible electric conductors, and thus possible to reduce resistance and inductance of the electric conductors to as small as possible.

Furthermore, the semiconductor device in accordance with the present invention can also be configured such that the electric conductor or the respective electric conductors has/have a linear shape.

Furthermore, the semiconductor device in accordance with the present invention can also be configured such that a distance between each of the at least one of all the electrodes and a corresponding one of the lead terminals, which are connected to each other via the electric conductor or a corresponding one of the electric conductors, is a shortest possible distance determined in consideration of mounting displacement of the plurality of semiconductor elements which have the electrodes.

Furthermore, the semiconductor device in accordance with the present invention can also be configured such that at least one of the plurality of semiconductor elements further has at least one electrode on its second surface.

Furthermore, the semiconductor device in accordance with the present invention can also be configured such that the one of or the different ones of the lead terminals connected to the electric conductor or the electric conductors functions/function as a terminal(s) connectable to outside.

Furthermore, the semiconductor device in accordance with the present invention preferably further includes an insulating spacer, wherein the one of or the different ones of the lead terminals connected to the electric conductor or the respective electric conductors is/are each supported on the metal plate via the spacer.

According to the configuration, even in a case where the lead terminals are not strong enough, it is possible to connect the electrodes of the semiconductor chip and the lead terminals via the electric conductors while maintaining the vertical positions of the lead terminals. This can be realized because the spacers and the metal plate can support the lead terminals.

Furthermore, the semiconductor device in accordance with the present invention can also be configured to further include a sealing resin for sealing at least the plurality of semiconductor elements, wherein one part of the one of or each of the different ones of the lead terminals connected to the electric conductor or the respective electric conductors is within the sealing resin, the part including the joined portion of the one of or each of the different ones of the lead terminals, and the other part is outside the sealing resin.

Furthermore, the semiconductor device in accordance with the present invention can also be configured such that the plurality of semiconductor elements are a first semiconductor element and a second semiconductor element; the lead terminals are a first lead terminal, a second lead terminal and a third lead terminal; the first semiconductor element and the second semiconductor element each include an N-channel power transistor having a drain electrode, a source electrode and a gate electrode; the drain electrode of the first semiconductor element is electrically connected to the first lead terminal; the source electrode of the first semiconductor element is electrically connected to the drain electrode of the second semiconductor element; the gate electrode of the first semiconductor element is electrically connected to the source electrode of the second semiconductor element; the source electrode of the second semiconductor element is electrically connected to the second lead terminal; and the gate electrode of the second semiconductor element is electrically connected to the third lead terminal.

Industrial Applicability

A semiconductor device of the present invention is applicable to a device which includes a power transistor.

REFERENCE SIGNS LIST 1, 1a, 1b, 1c, 1d Semiconductor device
2 Header (metal plate)
3, 3a, 3b Semiconductor chip (semiconductor element)
4, 4a, 4b Gate electrode (electrode)
5, 5a, 5b Source electrode (electrode)
7, 31 Gate terminal (lead terminal, third lead terminal)
8, 32 Drain terminal (lead terminal, first lead terminal)
9, 33 Source terminal (lead terminal, second lead terminal)
10 Molding resin (sealing resin)
11a, 11b, 11c, 11d, 11e, 11f, 11g Electric conductor
12 Spacer
20 Semiconductor device
21 Semiconductor chip (semiconductor element, first semiconductor element)
22, 26 Gate electrode (electrode)
23 Source electrode (electrode)
24, 27 Drain electrode (electrode)
25 Semiconductor chip (semiconductor element, second semiconductor element)

The invention claimed is

1. A semiconductor device comprising:
a metal plate;
one semiconductor element provided on the metal plate; and
at least three lead terminals electrically connected to the semiconductor element,
the semiconductor element having at least one electrode on its first surface and being provided on the metal plate so that a second surface opposite to the first surface faces the metal plate,
the lead terminals being provided so as not to overlap the semiconductor element,
the at least one electrode on the first surface of the semiconductor element being connected to one of or different ones of the lead terminals via an electric conductor or respective electric conductors,
a joined portion of the one of or each of the different ones of the lead terminals being close to the at least one electrode, the joined portion being joined to the electric conductor or a corresponding one of the electric conductors via which the at least one electrode and the one of or the different ones of the lead terminals are connected to each other, and
the at least one electrode being connected to the one of or the different ones of the lead terminals via the electric conductor or the respective electric conductors such that a joined portion(s), which is/are joined to the electric conductor or the respective electric conductors, of the at least one electrode being even with a joined portion(s), which is/are joined to the electric conductor or the respective electric conductors, of the one of or the different ones of the lead terminals,
the semiconductor device further comprising:
an insulating spacer,
the one of or the different ones of the lead terminals connected to the electric conductor or the respective electric conductors being each supported on the metal plate via the spacer, and
the spacer being provided under the joined portion(s), which is/are joined to the electric conductor or the respective electric conductors, of the one of or the different ones of the lead terminals.

2. The semiconductor device as set forth in claim 1, wherein the electric conductor or the respective electric conductors has/have a linear shape.

3. The semiconductor device as set forth in claim 1, wherein a distance between each of the at least one electrode and a corresponding one of the lead terminals, which are connected to each other via the electric conductor or a corresponding one of the electric conductors, is a shortest possible distance determined in consideration of mounting displacement of the semiconductor element.

4. The semiconductor device as set forth in claim 1, wherein the semiconductor element further has at least one electrode on the second surface.

5. The semiconductor device as set forth in claim 1, wherein the one of or the different ones of the lead terminals connected to the electric conductor or the respective electric conductors functions/function as a terminal(s) connectable to outside.

6. A semiconductor device as set forth in claim 1, further comprising a sealing resin for sealing at least the semiconductor element,
wherein one part of the one of or each of the different ones of the lead terminals connected to the electric conductor or the respective electric conductors is within the sealing resin, the part including the joined portion of the one of or each of the different ones of the lead terminals, and the other part is outside the sealing resin.

7. The semiconductor device as set forth in claim 1, wherein:
the semiconductor element includes a power transistor having a drain electrode, a source electrode, and a gate electrode; and
the lead terminals are a first lead terminal electrically connected to the drain electrode, a second lead terminal electrically connected to the source electrode, and a third lead terminal electrically connected to the gate electrode.

8. A semiconductor device comprising:
a metal plate;
a plurality of semiconductor elements provided on the metal plate; and
at least three lead terminals electrically connected to the plurality of semiconductor elements,
the plurality of semiconductor elements having at least one electrode on each of their first surfaces and being provided on the metal plate so that second surfaces opposite to the first surfaces face the metal plate,
the lead terminals being provided so as not to overlap the plurality of semiconductor elements,
at least one of all the electrodes on the first surfaces of the plurality of semiconductor elements being connected to one of or different ones of the lead terminals via an electric conductor or respective electric conductors,
a joined portion of the one of or each of the different ones of the lead terminals being close to the at least one of all the electrodes, the joined portion being joined to the electric conductor or a corresponding one of the electric conductors via which the at least one of all the electrodes and the one of or the different ones of the lead terminals are connected to each other, and
the at least one of all the electrodes being connected to the one of or the different ones of the lead terminals via the electric conductor or the respective electric conductors such that a joined portion(s), which is/are joined to the electric conductor or the respective electric conductors, of the at least one of all the electrodes being even with a joined portion(s), which is/are joined to the electric conductor or the respective electric conductors, of the one of or the different ones of the lead terminals,
the semiconductor device further comprising:
an insulating spacer,
the one of or the different ones of the lead terminals connected to the electric conductor or the respective electric conductors being each supported on the metal plate via the spacer, and
the spacer being provided under the joined portion(s), which is/are joined to the electric conductor or the respective electric conductors, of the one of or the different ones of the lead terminals.

9. The semiconductor device as set forth in claim 8, wherein the electric conductor or the respective electric conductors has/have a linear shape.

10. The semiconductor device as set forth in claim 8, wherein a distance between each of the at least one of all the electrodes and a corresponding one of the lead terminals, which are connected to each other via the electric conductor or a corresponding one of the electric conductors, is a shortest possible distance determined in consideration of mounting displacement of the plurality of semiconductor elements which have the electrodes.

11. The semiconductor device as set forth in claim 8, wherein at least one of the plurality of semiconductor elements further has at least one electrode on its second surface.

12. The semiconductor device as set forth in claim 8, wherein the one of or the different ones of the lead terminals connected to the electric conductor or the electric conductors functions/function as a terminal(s) connectable to outside.

13. A semiconductor device as set forth in claim 8, further comprising a sealing resin for sealing at least the plurality of semiconductor elements,
wherein one part of the one of or each of the different ones of the lead terminals connected to the electric conductor or the respective electric conductors is within the sealing resin, the part including the joined portion of the one of or each of the different ones of the lead terminals, and
the other part is outside the sealing resin.

14. The semiconductor device as set forth in claim 8, wherein:
the plurality of semiconductor elements are a first semiconductor element and a second semiconductor element;
the lead terminals are a first lead terminal, a second lead terminal and a third lead terminal;
the first semiconductor element and the second semiconductor element each include an N-channel power transistor having a drain electrode, a source electrode and a gate electrode;
the drain electrode of the first semiconductor element is electrically connected to the first lead terminal;
the source electrode of the first semiconductor element is electrically connected to the drain electrode of the second semiconductor element;
the gate electrode of the first semiconductor element is electrically connected to the source electrode of the second semiconductor element;
the source electrode of the second semiconductor element is electrically connected to the second lead terminal; and
the gate electrode of the second semiconductor element is electrically connected to the third lead terminal.

* * * * *